United States Patent
Lin

(10) Patent No.: US 11,008,512 B2
(45) Date of Patent: May 18, 2021

(54) QUANTUM DOT, LIGHT EMITTING MATERIAL AND MANUFACTURING METHOD OF QUANTUM DOT COMPRISING THERMAL TREATMENT OF SOLUTION CONTAINING FORMED QUANTUM DOT

(71) Applicant: Chi Mei Corporation, Tainan (TW)

(72) Inventor: Keng-Chu Lin, Tainan (TW)

(73) Assignee: Chi Mei Corporation, Tainan (TW)

( * ) Notice: Subject to any disclaimer, the term of this patent is extended or adjusted under 35 U.S.C. 154(b) by 184 days.

(21) Appl. No.: 16/166,191

(22) Filed: Oct. 22, 2018

(65) Prior Publication Data

US 2019/0119568 A1 Apr. 25, 2019

(30) Foreign Application Priority Data

Oct. 24, 2017 (TW) .................................. 106136465

(51) Int. Cl.
| | |
|---|---|
| *B82B 3/00* | (2006.01) |
| *C09K 11/88* | (2006.01) |
| *H01L 33/50* | (2010.01) |
| *B82Y 40/00* | (2011.01) |
| *B82Y 20/00* | (2011.01) |

(52) U.S. Cl.
CPC .......... *C09K 11/883* (2013.01); *B82B 3/0009* (2013.01); *B82B 3/009* (2013.01); *B82B 3/0033* (2013.01); *B82B 3/0038* (2013.01); *H01L 33/502* (2013.01); *H01L 33/507* (2013.01); *B82Y 20/00* (2013.01); *B82Y 40/00* (2013.01); *H01L 2933/0041* (2013.01)

(58) Field of Classification Search
CPC ... B82B 3/0009; B82B 3/0033; B82B 3/0038; B82B 3/009; B82B 3/0095; B82Y 40/00
See application file for complete search history.

(56) References Cited

U.S. PATENT DOCUMENTS

| | | | |
|---|---|---|---|
| 2015/0299567 A1* | 10/2015 | McDaniel | C09K 11/881 |
| | | | 252/301.6 S |
| 2017/0037314 A1* | 2/2017 | Nam | C09K 11/54 |
| 2018/0301592 A1* | 10/2018 | Peng | H01L 33/002 |
| 2019/0044025 A1* | 2/2019 | Chen | H01L 33/502 |
| 2019/0074354 A1* | 3/2019 | Bartel | G01N 33/588 |

FOREIGN PATENT DOCUMENTS

| | | |
|---|---|---|
| CN | 102280565 | 3/2014 |
| EP | 3323870 | 5/2018 |
| TW | 201340380 | 10/2013 |
| TW | 201503407 | 1/2015 |
| TW | 201700714 | 1/2017 |
| WO | 2009066548 | 5/2009 |
| WO | 2016162233 | 10/2016 |

\* cited by examiner

*Primary Examiner* — Hoa (Holly) Le
(74) *Attorney, Agent, or Firm* — JCIPRNET

(57) ABSTRACT

A quantum dot, a light emitting material, and a manufacturing method of quantum dot are provided. A ratio of an emission intensity to an absorption intensity of the quantum dot at a characteristic wavelength ranges from $1.5 \times 10^8$ CPS/Abs. to $2.0 \times 10^9$ CPS/Abs. The characteristic wavelength is a shorter wavelength of two wavelengths corresponding to half of a maximum intensity of an emission peak of the quantum dot.

7 Claims, 8 Drawing Sheets

QUANTUM DOT, LIGHT EMITTING MATERIAL AND MANUFACTURING METHOD OF QUANTUM DOT COMPRISING THERMAL TREATMENT OF SOLUTION CONTAINING FORMED QUANTUM DOT

CROSS-REFERENCE TO RELATED APPLICATION

This application claims the priority benefits of Taiwan application serial no. 106136465, filed on Oct. 24, 2017. The entirety of the above-mentioned patent application is hereby incorporated by reference herein and made a part of specification.

BACKGROUND

1. Technical Field

The disclosure relates to a light emitting material. More particularly, the disclosure relates to a light emitting material containing quantum dots.

2. Description of Related Art

A Quantum dot is a type of semiconductor light emitting material, and a band gap of the quantum dot can be varied by adjusting a grain size of the quantum dot. In this way, a wavelength range of the light emitted by the quantum dot can be changed by adjusting the size of the quantum dot. Since the quantum dot is characterized by its high color saturation or high chroma, the quantum dot has been gradually applied in the display panel technology in recent years. A quantum yield is one of the important parameters of the quantum dot. The quantum yield refers to the yield of which the quantum dot converts an incident light into a fluorescent light. Thereby, fabricating a quantum dot with improved quantum yield has become an important research subject in the art.

SUMMARY

The disclosure provides a quantum dot having an improved quantum yield.

The disclosure further provides a light emitting material containing a quantum dot having an improved quantum yield.

The disclosure further provides a manufacturing method of a quantum dot by which a self-absorption of the quantum dot can be reduced.

In an embodiment of the disclosure, a quantum dot is provided. A ratio of an emission intensity to an absorption intensity of the quantum dot at a characteristic wavelength ranges from $1.5 \times 10^8$ CPS/Abs. to $2.0 \times 10^9$ CPS/Abs. The characteristic wavelength is a shorter wavelength of two wavelengths corresponding to half of a maximum intensity of an emission peak of the quantum dot.

A light emitting material in an embodiment of the disclosure includes a carrier, the above-mentioned quantum dot, and a sealing layer. The quantum dot is attached to a surface of the carrier. The sealing layer encapsulates the carrier to which the quantum dot is attached.

A manufacturing method of quantum dot of an embodiment of the disclosure includes following steps. A first solution including a group 12 element, a group 13 element, or a group 14 element is provided. A second solution including a group 15 element or a group 16 element is provided. The first solution is mixed with the second solution to form a third solution. A material including a group 12 element, a group 13 element, or a group 14 element and a fourth solution including a group 15 element or a group 16 element are added to the third solution to form a fifth solution including a quantum dot. A thermal treatment is performed to the fifth solution, wherein a temperature of the thermal treatment is higher than a temperature of forming the fifth solution comprising the quantum dot by 15° C. to 75° C., and a time period of the thermal treatment is 3 minutes to 7 minutes. A ratio of an emission intensity to an absorption intensity of the quantum dot at a characteristic wavelength ranges from $1.5 \times 10^8$ CPS/Abs. to $2.0 \times 10^9$ CPS/Abs. after the thermal treatment, and the characteristic wavelength is a shorter wavelength of two wavelengths corresponding to half of a maximum intensity of an emission peak of the quantum dot after the thermal treatment.

To sum up, in the manufacturing method of quantum dot of the embodiments in the disclosure, the thermal treatment is performed to the solution containing the quantum dot. The temperature of the thermal treatment is higher than the temperature of forming the solution comprising the quantum dot by 15° C. to 75° C., and the time period of the thermal treatment ranges from 3 minutes to 7 minutes. As such, Stokes shift between the absorption peak and the emission peak of the quantum dot can be increased. Thereby, the ratio of the emission intensity to the absorption intensity of the quantum dot at a characteristic wavelength after the thermal treatment is increased, and is ranged from $1.5 \times 10^8$ CPS/Abs. to $2.0 \times 10^9$ CPS/Abs. The characteristic wavelength is the shorter wavelength of the two wavelengths corresponding to half of the maximum intensity of the emission peak of the quantum dot. Therefore, the self-absorption phenomenon of the quantum dot can be lowered, and the quantum yield of the quantum dot can thus be improved.

To make the aforementioned and other features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
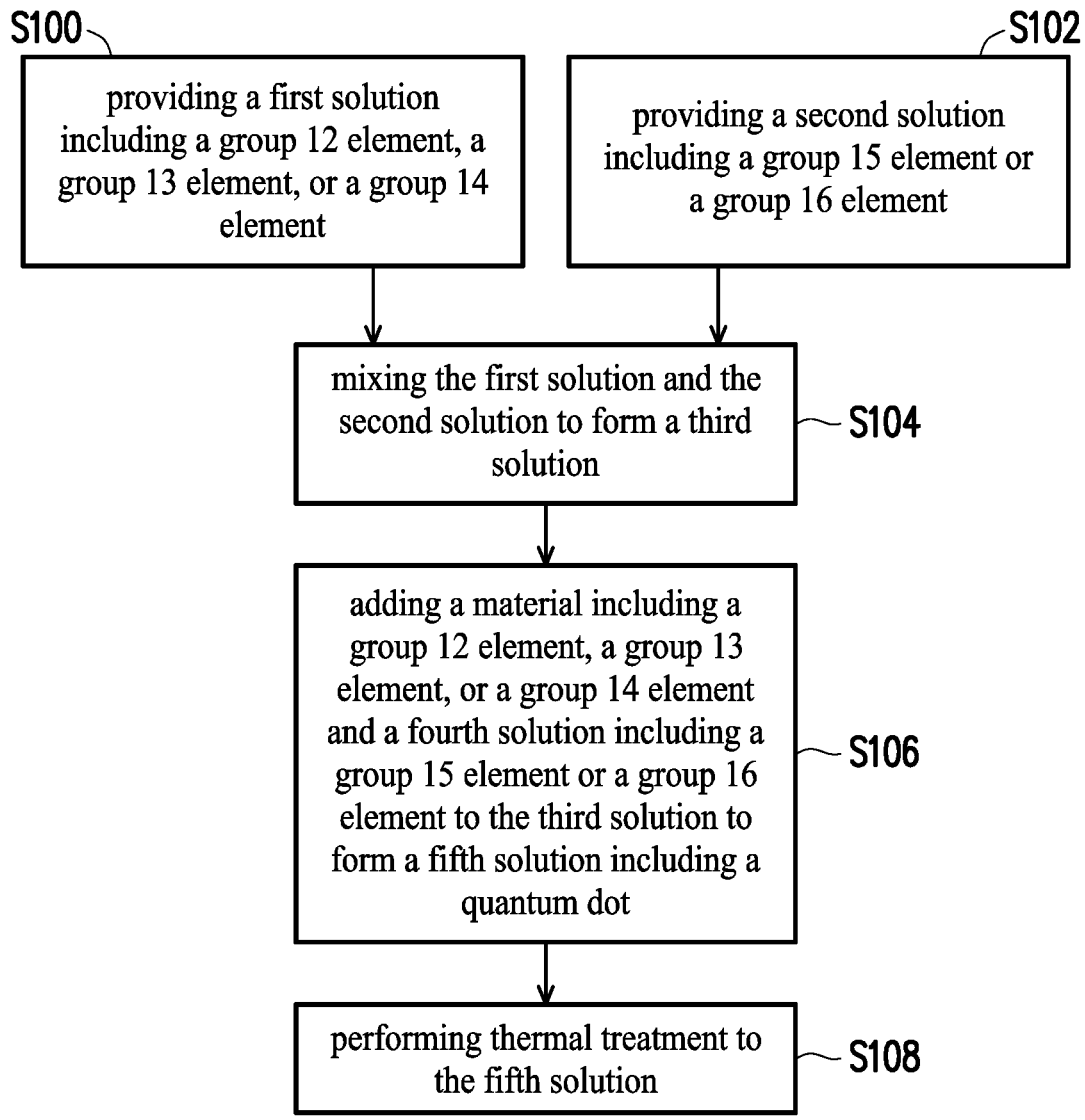
FIG. 1 is a flowchart of a manufacturing method of quantum dot according to an embodiment of the disclosure.

FIG. 1 is a flowchart of a manufacturing method of quantum dot according to an embodiment of the disclosure.

Figure 2A:
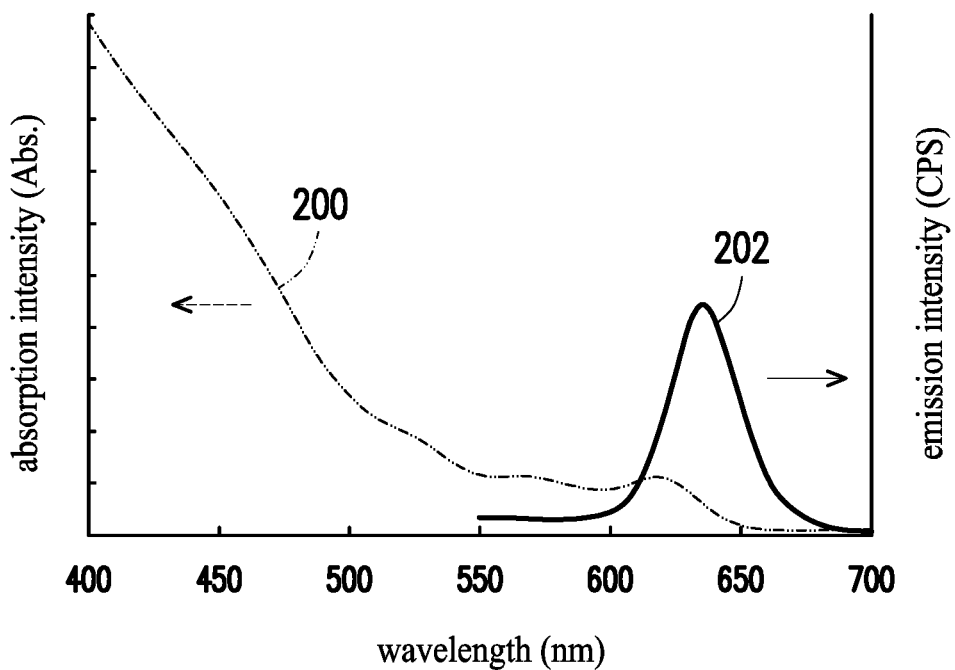
FIG. 2A is a graph illustrating an emission intensity and an absorption intensity versus a wavelength of a quantum dot which has not been thermally treated.
Figure 2B:
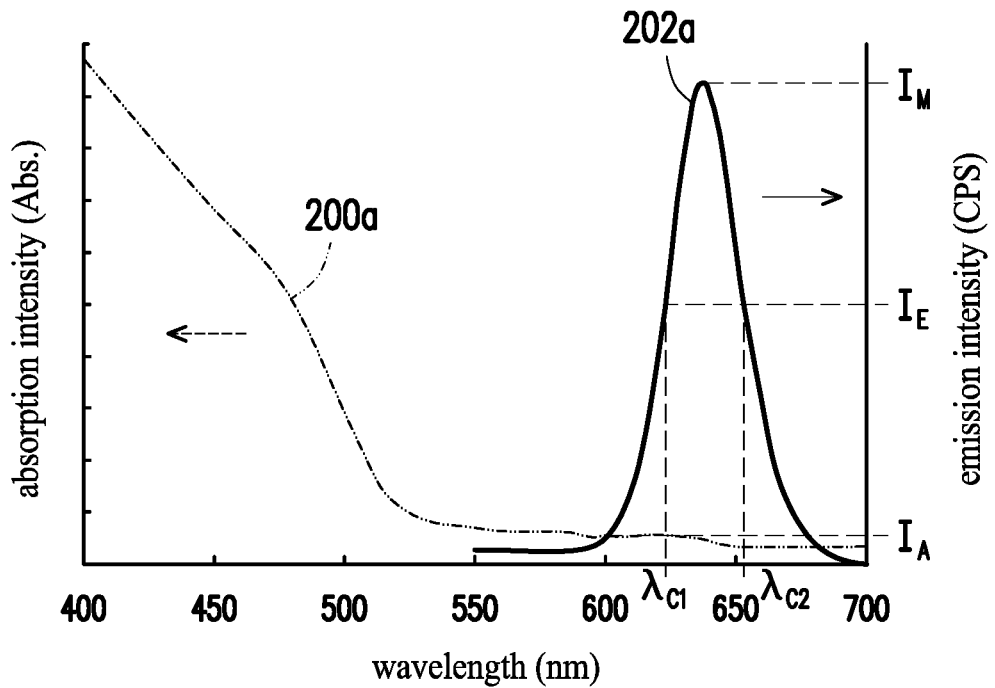
FIG. 2B is a graph illustrating an emission intensity and an absorption intensity versus a wavelength of a quantum dot which has been thermally treated at a temperature of 280° C. according to an embodiment of the disclosure.

FIG. 2A is a graph illustrating an emission intensity and an absorption intensity versus a wavelength of a quantum dot which has not been thermally treated. FIG. 2B is a graph illustrating an emission intensity and an absorption intensity versus a wavelength of a quantum dot which has been thermally treated at a temperature of 280° C. according to an embodiment of the disclosure.

With reference to FIG. 1, a manufacturing method of quantum dot of the present embodiment includes the following steps. Step S100 is performed, and a first solution including a group 12 element, a group 13 element, or a group 14 element is provided. To be specific, the group 12 element, the group 13 element, or the group 14 element may exist in the first solution in a form of a positive ion. For instance, the group 12 element in the first solution may include zinc, cadmium, mercury, or a combination of the foregoing. The group 13 element in the first solution may include aluminum, gallium, indium, or a combination of the foregoing. The group 14 element in the first solution may include tin, lead, or a combination of the foregoing. In some embodiments, the group 12 element (or a precursor formed by the group 12 element), the group 13 element (or a precursor formed by the group 13 element), or the group 14 element (or the precursor formed by the group 14 element) may be mixed with an organic acid to form the first solution. The organic acid may include oleic acid (OA), stearic acid, lauric acid, or a combination of the foregoing. In some embodiments, after the first solution has been formed, the first solution may be further allowed to react at a temperature ranged from 160° C. to 200° C. In some embodiments, after the foregoing reaction has been performed, the temperature the first solution may be further increased to a range from 230° C. to 330° C.

Step S102 is performed, and a second solution including a group 15 element or a group 16 element is provided. To be specific, the group 15 element or the group 16 element may exist in the second solution in a form of a negative ion. For instance, the group 15 element in the second solution may include at least one of nitrogen, phosphorous, and arsenic. The group 16 element in the second solution may include at least one of oxygen, sulfur, selenium, and tellurium. In some embodiments, the group 15 element (or a precursor formed by the group 15 element) or the group 16 element (or a precursor formed by the group 16 element) may be mixed with an organic solution. The organic solution may include trioctylphosphine (TOP), octadecene (ODE), tributylphosphine, dioctyl amine, or a combination of the foregoing. In some embodiment, step S102 may be performed at a room temperature. The room temperature may range from 20° C. to 30° C.

In some embodiments, step S100 and step S102 may be performed simultaneously. In other embodiments, step S100 may be performed before or after step S102, and the disclosure is not intended to limit the order by which step S100 and step S102 are performed.

Step S104 is performed, and the first solution and the second solution are mixed to form a third solution. In step S104, at least one positive ion in the first solution is reacted with at least one negative ion in the second solution to form a binary, ternary, quaternary, or other multicomponent semiconductor material. In some embodiments, the semiconductor material may be an inner core of a quantum dot. In other embodiments, the semiconductor material may have a core-shell structure to serve as an inner core and an inner shell of a quantum dot. The inner shell may be a single-layered structure or a multi-layered structure. Further, the semiconductor material may be formed to have a substantially sphere-shaped contour. In other words, the semiconductor material may be sphere-shaped with an aspect ratio of approximately 1. In some embodiments, the semiconductor material may be a group 12-group 16 semiconductor, a group 13-group 15 semiconductor or a group 14-group 16 semiconductor. For instance, the group 12-group 16 semiconductor may be at least one selected from a group consisting of CdO, CdS, CdSe, CdTe, ZnO, ZnS, ZnSe, ZnTe, HgO, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, and HgZnSTe. The group 13-group 15 semiconductor may be at least one selected from a group consisting of GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, InCuSe, and InAlPAs. The group 14-group 16 semiconductor may be at least one selected from a group consisting of SnS, SnSe, SnTe, PbS, PbSe, PbTe, SnSeS, SnSeTe, SnSTe, PbSeS, PbSeTe, PbSTe, SnPbS, SnPbSe, SnPbTe, SnPbSSe, SnPbSeTe, and SnPbSTe. In some embodiments, after the third solution has been forming, the third solution is further allowed to react at a temperature ranged from 230° C. to 330° C. In some embodiments, after the foregoing reaction has been performed, the third solution may be further cooled down to the room temperature, and the room temperature may range from 20° C. to 30° C.

Step S106 is performed, and a material including a group 12 element, a group 13 element, or a group 14 element and a fourth solution including a group 15 element or a group 16 element are added to the third solution to form a fifth solution including a quantum dot. In some embodiments, the group 12 element, the group 13 element, or the group 14 element in the material may respectively be different from the group 12 element, the group 13 element, or the group 14 element in the first solution. In addition, the group 15 element or the group 16 element in the fourth solution may respectively be different from the group 15 element or the group 16 element in the second solution. In some embodiments, the material including the group 12 element, the group 13 element, or the group 14 element and the fourth solution including the group 15 element or the group 16 element may be added to the third solution in sequence. In other embodiments, the material including the group 12 element, the group 13 element, or the group 14 element and the fourth solution including the group 15 element or the group 16 element may be added to the third solution simultaneously. In step S106, an outer shell may be formed on a surface of the inner core (or the inner shell) of the quantum dot. As such, the quantum dot may have the outer shell and the inner core or may have the outer shell, the inner shell, and the inner core from outside in. The outer shell may be formed on the surface of the inner core (or the inner shell) through covalent bonding. The quantum dot including the outer shell and the inner core (or the outer shell, the inner shell, and the inner core) still maintains the sphere-shaped contour. In some embodiments, the outer shell may be a single-layered structure. In other embodiments, the outer shell may be a multi-layered structure. In some embodiments, after the fourth solution has been added to the third solution, a mixed solution including the fourth solution and the third solution is further allowed to react at a temperature ranged from 220° C. to 260° C. to form the fifth solution including the quantum dot having the outer shell. In the process of forming the outer shell, by heating the mixed solution including the fourth solution and the third solution, molecules constituting the outer shell may be allowed to preferably nucleate on the surface of the inner core (or the inner shell) of the quantum dot rather than being dispersed in the solution. In this way, the outer shell of the quantum dot may better protect the inner core (or the inner core and the inner shell) to prevent the inner core (or the inner core and the inner shell) from being damaged by external water, oxygen, and blue light. Therefore, reliability of the quantum dot is improved.

Step S108 is performed, and a thermal treatment is performed to the fifth solution. The thermal treatment performed to the fifth solution is referred as the thermal treatment performed to the fifth solution comprising the quantum dot, that is, the thermal treatment performed to the quantum dot. A temperature of the thermal treatment performed to the fifth solution is at least 15° C. to 75° C. or 20° C. to 50° C. higher than the temperature of forming the outer shell of the quantum dot in the aforementioned step S106 (which is ranged from 220° C. to 260° C.). In other words, the temperature of the thermal treatment in the step S108 is higher than the temperature range in the step S106 by 15° C. to 75° C. or 20° C. to 50° C. The temperature range of the thermal treatment is ranged from 275° C. to 295° C. In some embodiments, the temperature range of the thermal treatment may be ranged from 280° C. to 290° C. Beside, a time period of the thermal treatment ranges from 3 minutes to 7 minutes or from 4 minutes to 6 minutes. In some embodiment, the thermal treatment may be performed in inert atmosphere. For instance, the inert gas in the inert atmosphere may include nitrogen or argon. In some embodiments, a ratio of a diameter of the quantum dot after the thermal treatment to the diameter of the quantum dot before the thermal treatment ranges from 1.0 to 1.3. Particularly, a diameter of the inner core before the thermal treatment may be identical to the diameter of the inner core after the thermal treatment. In some embodiments, the quantum dot further includes the inner shell, and the diameter of the inner core and a thickness of the inner shell before the thermal treatment may respectively be identical to the diameter of the inner core and the thickness of the inner shell after the thermal treatment. Besides, a ratio of a thickness of the outer shell after the thermal treatment to the thickness of the outer shell before the thermal treatment may be ranged from 1.0 to 1.6. Further, through performing the thermal treatment to the quantum dot, element distribution of the quantum dot may be changed, or a number of defects in the quantum dot may be reduced. In some embodiments, after step S106 has been performed, a temperature of the fifth solution is raised immediately to perform step S108, of which the thermal treatment is performed to the fifth solution.

Thereafter, the quantum dot of this embodiment may then be obtained after performing operations of centrifugal separation and washing to the solution obtained in step S108. The quantum dot of this embodiment has a substantial sphere-shaped contour. An aspect ratio of the quantum dot having the sphere-shaped contour may range from 0.7 to 1.3, preferably from 0.8 to 1.2, and more preferably from 0.9 to 1.1. In addition, a wavelength range of the light emitted by the quantum dot may be adjusted through changing a composition and a size of the quantum dot. In some embodiments, the quantum dot may be a quantum dot emitting a red light, which is also referred as a red quantum dot. In other embodiments, the quantum dot may be a quantum dot emitting a green light or a blue light, which may also referred as a green quantum dot or a blue quantum dot, respectively. Particularly, when the quantum dot receives an incident light with a wavelength longer than or equal to 350 nm and shorter than a wavelength of the light emitted by the quantum dot, such as an incident light with a wavelength ranged from 390 nm to 500 nm, the quantum dot can emit light with a wavelength ranged from 400 nm to 700 nm. In addition, a full width at half maximum of a peak of the light emitted by the quantum dot is, for instance, ranged from 20 nm to 60 nm. In some embodiments, a wavelength of the light emitted by the red quantum dot is, for example, ranged from 600 nm to 700 nm, from 605 nm to 680 nm, or from 610 nm to 660 nm. In other embodiments, a wavelength of the light emitted by the green quantum dot is, for example, ranged from 500 nm to 600 nm, from 510 nm to 560 nm, or from 520 nm to 550 nm. A wavelength of the light emitted by the blue quantum dot is, for example, ranged from 400 nm to 500 nm, from 430 nm to 470 or from 440 nm to 460 nm. In some embodiments, a full width at half maximum of a peak of the light emitted by the red quantum dot is, for example, ranged from 30.0 nm to 35.0 nm, from 30.0 nm to 34.0 nm, or from 31.0 nm to 34.0 nm. For instance, the wavelength, intensity, and full width at half maximum of the light emitted by the quantum dot may be obtained through photoluminescence analysis by a photoluminescence analyzer manufactured by HORIBA, Ltd. (model number: FluoroMax-3).

In some embodiments, an average particle diameter of the red quantum dot is, for example, ranged from 3 nm to 25 nm, from 4 nm to 15 nm, or from 5 nm to 10 nm. An average particle diameter of the green quantum dot is, for example, ranged from 2 nm to 20 nm, from 3 nm to 15 nm, or from 4 nm to 9 nm. An average particle diameter of the blue quantum dot is, for example, ranged from 1 nm to 15 nm, from 2 nm to 10 nm, or from 2 nm to 8 nm.

As described above, in the manufacturing method of the quantum dot according to this embodiment, the thermal treatment is performed to the solution containing the quantum dot. The temperature of the thermal treatment is higher than the temperature of forming the solution comprising the quantum dot by 15° C. to 75° C., and the time period of the thermal treatment ranges from 3 minutes to 7 minutes. As a result of the thermal treatment, an absorption peak of the quantum dot can shifted to a shorter wavelength, whereas an emission peak of the quantum dot may be remained the same or slightly shifted to a longer wavelength. As such, an intensity of the emission peak of the quantum dot is increased.

With reference to FIG. 2A, an absorption peak 200 (presented by the dotted line) and an emission peak 202 (presented by the solid line) of the quantum dot has not been thermally treated are partially overlapped. With reference to FIG. 2B, after the thermal treatment has been performed at a temperature of 280° C., a wave form of an absorption peak 200a (presented by the dotted line) of the quantum dot is changed and is shifted to a shorter wavelength, and a position of an emission peak 202a (presented by the solid line) is barely changed. As such, Stokes shift between the absorption peak and the emission peak of the quantum dot may be increased. With reference to FIG. 2B, a ratio of an emission intensity $I_E$ to an absorption intensity $I_A$ of the quantum dot ($I_E/I_A$) at a characteristic wavelength $\lambda_{c1}$ ranges from $1.5 \times 10^8$ CPS/Abs. to $2.0 \times 10^9$ CPS/Abs. after the thermal treatment has been performed. The characteristic wavelength $\lambda_{c1}$ is the shorter wavelength of the two wavelengths (the characteristic wavelength $\lambda_{c1}$ and a characteristic wavelength $\lambda_{c2}$) corresponding to half of a maximum intensity $I_M$ of the emission peak of the quantum dot. Preferably, the ratio of the emission intensity $I_E$ to the absorption intensity $I_A$ of the quantum dot ($I_E/I_A$) ranges from $2.0 \times 10^8$ CPS/Abs. to $1.0 \times 10^9$ CPS/Abs. at the characteristic wavelength $\lambda_{c1}$. More preferably, the ratio of the emission intensity $I_E$ to the absorption intensity $I_A$ of the quantum dot ($I_E/I_A$) ranges from $2.0 \times 10^8$ CPS/Abs. to $6.0 \times 10^8$ CPS/Abs. at the characteristic wavelength $\lambda_{c1}$. Accordingly, a self-absorption phenomenon of the quantum dot may be avoided, and thus a quantum yield of the quantum dot can be increased. With reference to FIG. 2A and FIG. 2B, in the embodiments of the disclosure, a unit of the emission intensity $I_E$ of the quantum dot at the characteristic wavelength $\lambda_{c1}$ is CPS (Counts Per Second), which refers to a count of photons per second at the characteristic wavelength $\lambda_{c1}$; a unit of the absorption intensity $I_A$ of the quantum dot at the characteristic wavelength $\lambda_{c1}$ is Abs. (Absorbance Unit), which refers to an absorbance at the characteristic wavelength $\lambda_{c1}$.

Figure 3:
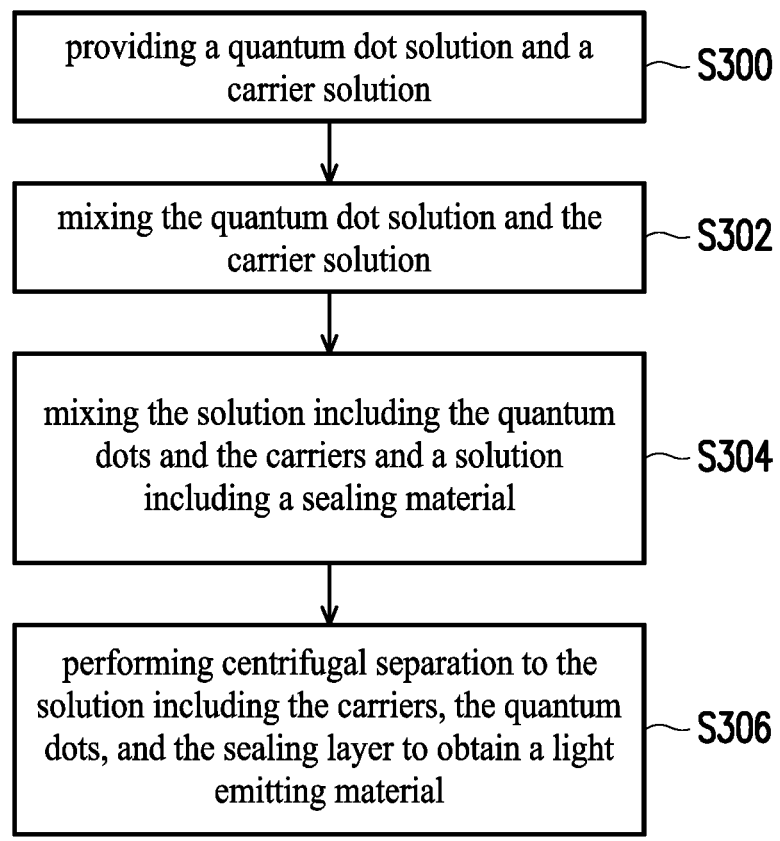
FIG. 3 is a flowchart of a manufacturing method of light emitting material according to an embodiment of the disclosure.

FIG. 3 is a flowchart of a manufacturing method of light emitting material according to an embodiment of the disclosure. FIG. 4A to FIG. 4J are schematic diagrams illustrating display apparatuses according to a plurality embodiments of the disclosure. With reference to FIG. 3, in some embodiments, the manufacturing method of light emitting material based on the above-mentioned quantum dot may include the following steps.

Step S300 is performed, and a quantum dot solution and a carrier solution are provided. The quantum dot solution includes the quantum dots formed through step S100 to step S108, and a solvent configured to disperse the quantum dots. Similarly, the carrier solution includes carriers and a solvent configured to disperse the carriers. For instance, the solvent of the quantum dot solution and the solvent of the carrier solution may respectively include n-hexane or toluene. In some embodiments, a weight percentage of the quantum dots in the quantum dot solution ranges from 0.1% to 5%. A weight percentage of the carriers in the carrier solution ranges from 0.5% to 10%.

In some embodiments, a material of the carriers may be at least one selected from a group consisting of organic polymer, inorganic polymer, water-soluble polymer, organic solvent-soluble polymer, biopolymer, and synthetic polymer. For instance, the material of the carriers may be at least one of a group consisting of polysiloxane, polyacrylate, polycarbonate, polystyrene, polyethylene, polypropylene, polyketides, polyetheretherketone, polyester, polyamide, polyimide, polyacrylamide, polyolefins, polyacetylene, polyisoprene, polybutadiene, polyvinylidene difluoride (PVDF), polyvinyl chloride (PVC), ethylene vinyl acetate (EVA), polyethylene terephthalate (PET), polyurethane, and cellulose polymer. In some embodiments, the material of the carriers may also be an inorganic medium, for example, may be at least one selected from a group consisting of silica gel, bentonite, glass, quartz, kaolin, silicon dioxide, aluminium oxide, and zinc oxide. In some embodiments, the material of the carriers is preferably silicon oxide, for example, is at least one selected from a group consisting of polysiloxane, glass, water glass, and silicon dioxide.

The water glass is a material formed by combining alkaline metal oxide and silicon dioxide. The water glass may be categorized into lithium water glass, sodium water glass, and potassium water glass based on the types of alkaline metal. Molecular formulas of lithium water glass, sodium water glass, and potassium water glass are $Li_2O \cdot nSiO_2$, $Na_2O \cdot nSiO_2$, and $K_2O \cdot nSiO_2$, respectively. In the molecular formulas, n refers to a modulus of water glass, which stands for a molecular ratio (or a molar ratio) of silicon oxide with respect to alkaline metal oxide in the water glass. The modulus n may range from 1.5 to 4.0, or range from 2.0 to 3.5.

Polysiloxane is obtained through hydrolysis condensation reaction by adding water to the siloxane compound shown in the following formula (I):

$R^a$ refers to a $C_6$ to $C_{15}$ aromatic group, and $R^b$ refers to a $C_1$ to $C_5$ alkyl group. The aromatic group is, for example (but not limited to), a phenyl group, a tolyl group, p-hydroxyphenyl, 1-(p-hydroxyphenyl) ethyl, 2-(p-hydroxyphenyl) ethyl, 4-hydroxy-5-(p-hydroxyphenylcarbonyloxy) pentyl, or a naphthyl group. Alkyl is, for example (but not limited to), a methyl group, an ethyl group, a n-propyl group, an isopropyl group, or a n-butyl group. In some embodiments, the polysiloxane may be obtained through hydrolysis and condensation reaction of tetraethoxysilane (TEOS).

An average particle diameter of the carriers is, for example, 0.1 μm to 25 μm, 0.3 μm to 15 μm, or 0.5 μm to 10 μm. In some embodiments, the material of the carriers is porous. An average surface pore size of the porous carriers is 3 nm to 100 nm. In some embodiments, the quantum dots are the red quantum dots, and the average surface pore size of the porous carriers is, for example, 7 nm to 40 nm, 7 nm to 35 nm, or 7 nm to 30 nm. In other embodiments, the quantum dots are the green quantum dots, and the average surface pore size of the porous carriers is, for example, 5 nm to 30 nm, 5 nm to 25 nm, or 5 nm to 20 nm. In addition, when the quantum dots are the blue quantum dots, the average surface pore size of the porous carriers is, for example, 3 nm to 25 nm, 3 nm to 20 nm, or 3 nm to 15 nm. A specific surface area of the porous carriers is, for example, 100 $m^2/g$ to 1000 $m^2/g$. In some embodiments, the porous carriers are porous microparticles. The porous microparticles may be silicon dioxide particles. The carriers may be lipophilic carriers. For instance, the porous microparticles may be lipophilic silicon dioxide particles. The lipophilic silicon dioxide particles are obtained by modifying the silicon dioxide particles through a silicone compound presented by the following formula (II):

$R^c$ refers to a $C_3$ to $C_{20}$ alkyl group, and $R^d$ refers a $C_1$ to $C_5$ alkyl group. In some embodiments, $R^c$ is an octyl group, a nonyl group, or a decyl group. $R^d$ for example (but not limited to), a methyl group, an ethyl group, a n-propyl group, an isopropyl group, or a n-butyl group.

Each porous carrier consisted of silicon dioxide may have an average particle diameter of 1 μm to 5 μm, an average surface pore size of 5 nm to 15 nm, and a specific surface area of 500 $m^2/g$ to 900 $m^2/g$; or each porous carrier may have an average particle diameter of 1 μm to 5 μm, an average surface pore size of 10 nm to 30 nm, and a specific surface area of 250 $m^2/g$ to 750 $m^2/g$; or each porous carrier may have an average particle diameter of 0.5 μm to 1.5 μm, an average surface pore size of 5 nm to 15 nm, and a specific surface area of 200 $m^2/g$ to 600 $m^2/g$; or each porous carrier may have an average particle diameter of 0.1 μm to 0.5 μm, an average surface pore size of 3 nm to 12 nm, and a specific surface area of 100 $m^2/g$ to 500 $m^2/g$.

In some embodiments, an organic group may be used to modify surfaces of the quantum dots. The organic group may be referred to as a sealing agent, which can suppress aggregation of the quantum dots and also can moderately isolate the quantum dots from the external environment. The sealing agent may be consisted of a Lewis base compound.

In some embodiments, hydrocarbons in the inert solvent can be diluted to form the Lewis base compound described above. The sealing agent may include a monofunctional or a multifunctional ligand such as phosphines, phosphine oxide, alkylphosphonic acids, alkylamines, arylamines, pyridines, long chain fatty acids, thiophenes, or a combination of the foregoing. For instance, phosphines may include trioctylphosphine, triphenylphosphine, tritertiarybutylphosphine, and the like. Phosphine oxide may include trioctylphosphine oxide, triphenylphosphine oxide, and the like. Alkylamines may include hexadecylamine, octylamine, and the like.

Step S302 is performed, and the quantum dot solution and the carrier solution are mixed. In step S302, the quantum dots in the quantum dot solution may be attached onto the carriers in the carrier solution. In some embodiments, the carriers are porous carriers, such that the quantum dots may be evenly and stably attached onto the carriers.

Next, step S304 is performed, the solution including the quantum dots and the carriers and a solution including a sealing material are mixed. In step S304, the sealing material may encapsulate the surfaces of the carriers to which the quantum dots are attached to form a sealing layer. In some embodiments, a thickness of the sealing layer may be ranged from 0.1 nm to 20 nm.

In some embodiments, the sealing material may be at least one selected from a group consisting of organic polymer, inorganic polymer, water-soluble polymer, organic solvent-soluble polymer, biopolymer, and synthetic polymer. For instance, the sealing material may be at least one of a group consisting of polysiloxane, polyacrylate, polycarbonate, polystyrene, polyethylene, polypropylene, polyketides, polyetheretherketone, polyester, polyamide, polyimide, polyacrylamide, polyolefins, polyacetylene, polyisoprene, polybutadiene, polyvinylidene difluoride (PVDF), polyvinyl chloride (PVC), ethylene vinyl acetate (EVA), polyethylene terephthalate (PET), polyurethane, and cellulose polymer. In some embodiments, the sealing material may be an inorganic medium, for example, may be at least one selected from a group consisting of silica gel, bentonite, glass, quartz, kaolin, silicon dioxide, aluminium oxide, and zinc oxide. In some embodiments, the sealing layer and the carriers may be constituted by the same material. In other embodiments, the sealing layer and the carriers may be constituted by different materials.

Next, step S306 is performed, and centrifugal separation is performed to the solution including the carriers, the quantum dots, and the sealing layer to obtain a light emitting material. In other words, the light emitting material may include the carriers, the quantum dots, and the sealing layer. The quantum dots are attached to the surfaces of the carriers, and the sealing layer encapsulates the quantum dots and the carriers.

In some embodiments, a weight percentage of the quantum dots in the light emitting material may range from 0.1% to 30%. In other embodiments, the weight percentage of the quantum dots in the light emitting material may range from 0.2% to 25%, or from 0.3% to 20%. When the weight percentage of the quantum dots in the light emitting material is less than 0.1%, a concentration of the quantum dots in the light emitting material is relatively low, and a light emitting efficiency of the overall light emitting material is poor. When the weight percentage of the quantum dots in the light emitting material is greater than 30%, a self-absorption phenomenon of the quantum dots may occur easily, and the light emitting efficiency of the overall light emitting material is thus lowered and a red shift would be observed. For instance, the weight percentage may be obtained through a spectrographic analysis of inductively coupled plasma (ICP).

In some embodiments, the light emitting material may be applied in a packaging material of a light emitting apparatus. For instance, the packaging material of the light emitting apparatus may include epoxy resin, polysiloxane resin, acrylic resin, glass, or the like. In the light emitting apparatus, a primary light generated by a light source (e.g., a light emitting diode, a laser source, an arc lamp, and a black body light source) may excite the quantum dots to generate a secondary light. A wavelength range of the primary light may be different from a wavelength range of the secondary light. In other words, a color of the primary light may be different from a color of the secondary light. In addition, the color of the primary light and the color of the secondary light may be appropriately mixed, in order to satisfy a predetermined intensity and wavelength of the light emitted by the overall light emitting apparatus. Note that the light emitted by the light emitting apparatus may be the light emitted by the quantum dots (i.e., the secondary light) only or may be the light generated by mixing the light generated by the light source and the light generated by the quantum dots (i.e., generated by mixing the primary light and the secondary light). In some embodiments, quantum dots of one or more colors may be included in the light emitting material.

In some embodiments, a light emitting diode (LED) using the light emitting material of this embodiment may be served as a light emitting component of a backlight unit or other light emitting apparatuses. Moreover, a plurality of light emitting diodes using the light-emitting material of the this embodiment can also be arranged in a quantum dot light-emitting diode (QLED) display equipment, and each light emitting diode in the QLED display equipment is a single pixel.

Figure 4A:
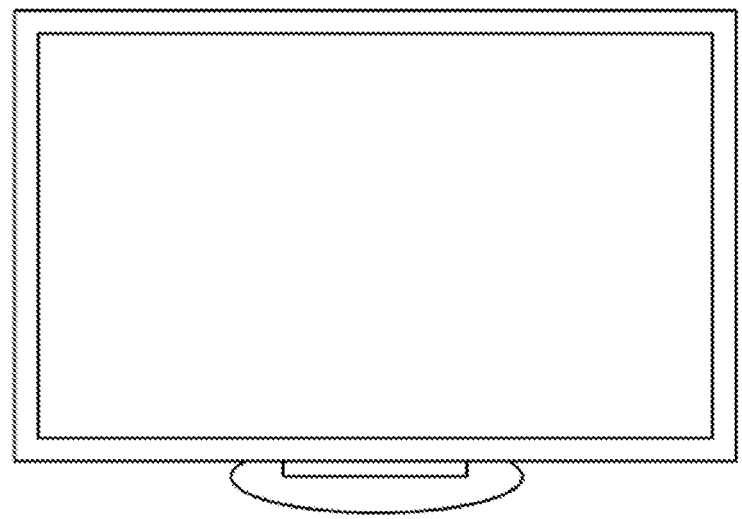
FIG. 4A to FIG. 4J are schematic diagrams illustrating display apparatuses according to a plurality embodiments of the disclosure.
Figure 4B:
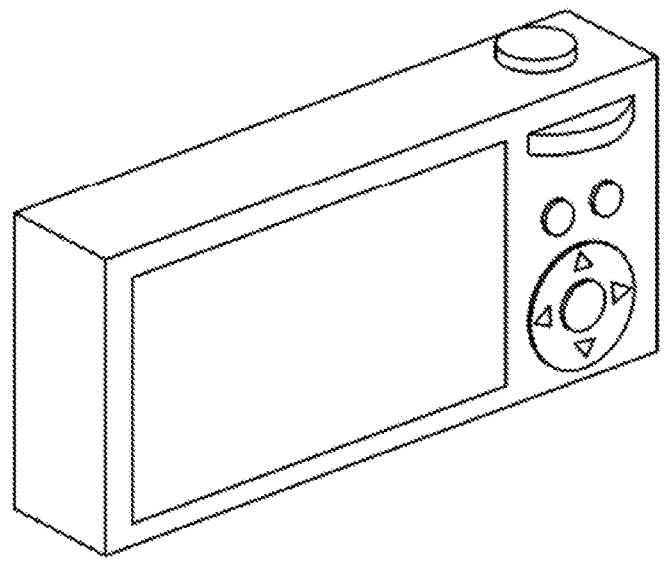
Figure 4C:
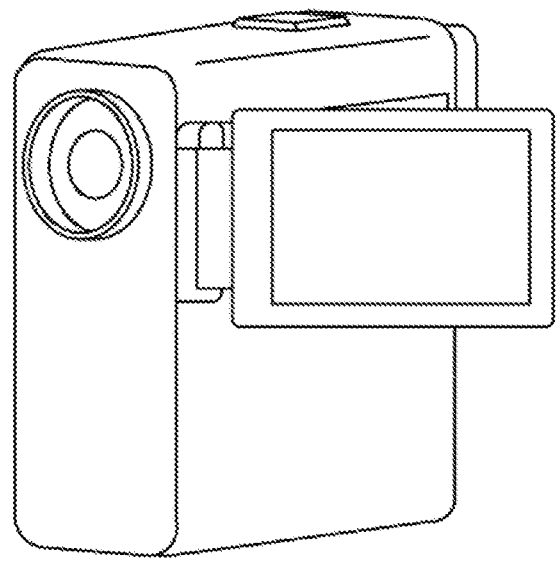
Figure 4D:
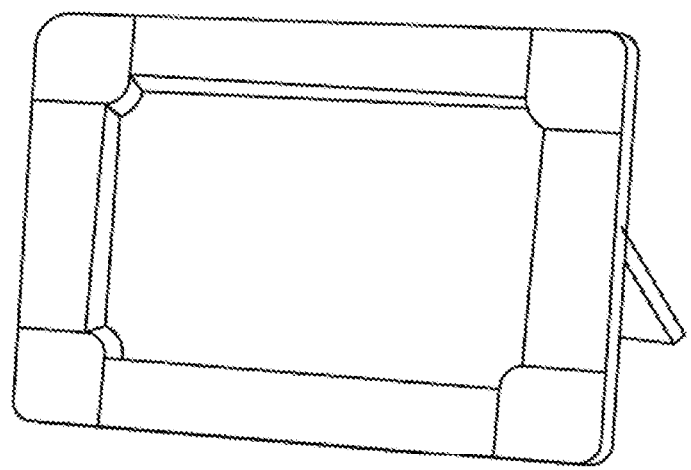
Figure 4E:
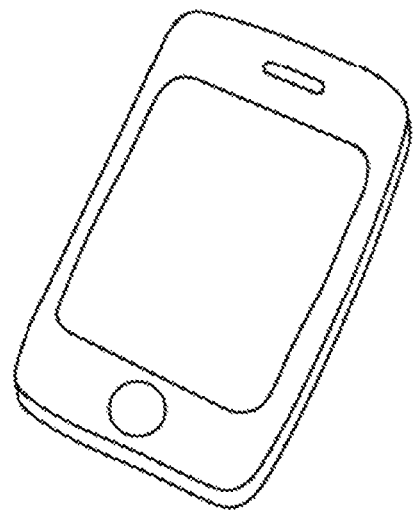
Figure 4F:
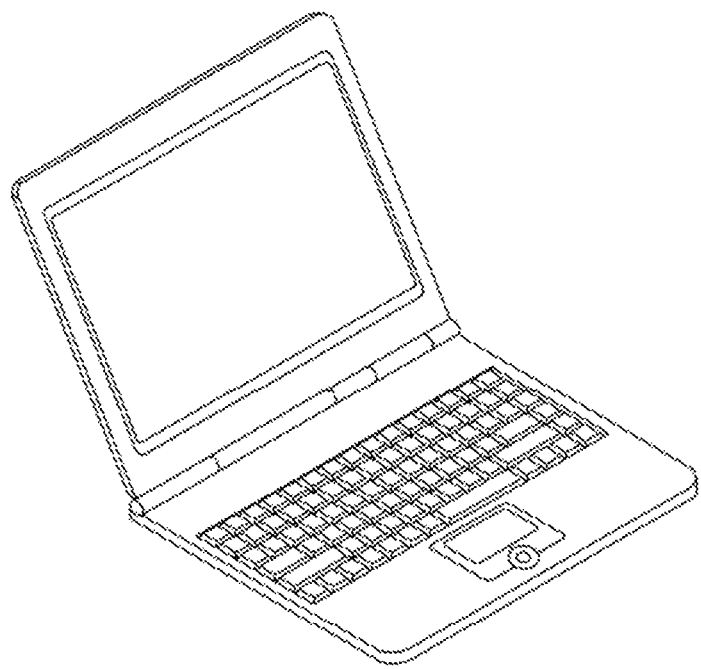
Figure 4G:
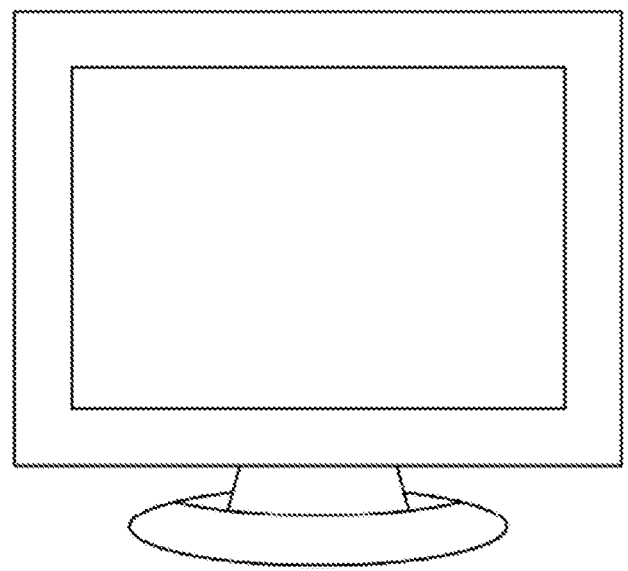
Figure 4H:
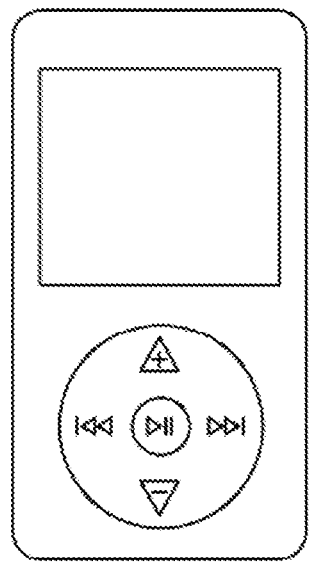
Figure 4I:
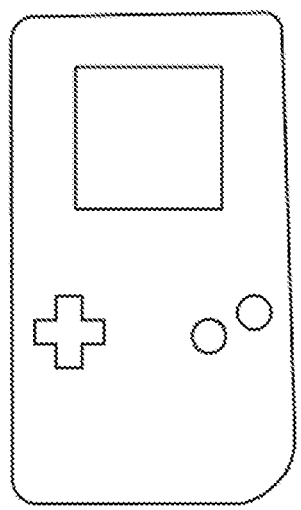
Figure 4J:
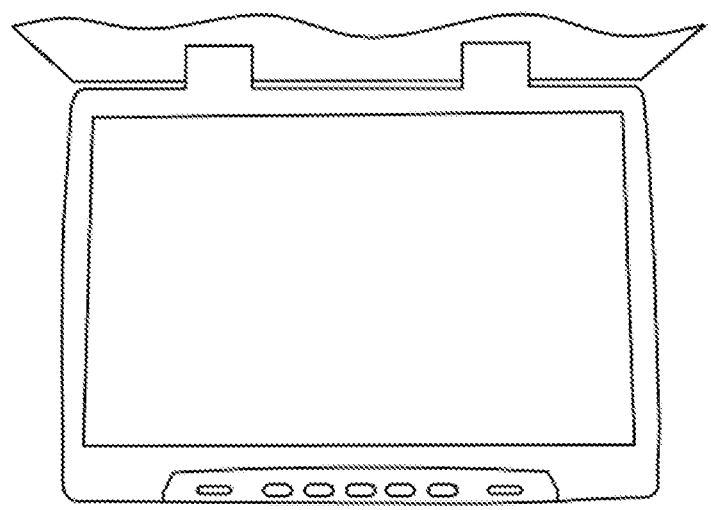

In some embodiments, the light emitting material of the embodiments of the disclosure may be applied to a variety of display apparatuses. Examples of the display apparatus may include a television (also referred to as a TV or a TV receiver) (as shown in FIG. 4A), a digital camera (as shown in FIG. 4B), a digital video camera (as shown in FIG. 4C), a digital photo frame (as shown in FIG. 4D), a mobile phone (as shown in FIG. 4E), a notebook personal computer (as shown in FIG. 4F), a mobile computer, a monitor configured for a computer and the like (as shown in FIG. 4G), a portable game console, a portable information terminal, an audio reproduction apparatus (as shown in FIG. 4H), a game console (as shown in FIG. 4I), and a car display (as shown in FIG. 4J).

Experimental Example 1, Experimental Example 2, Comparative Example 1, Comparative Example 2, and Comparative Example 3 are listed below to verify the effect of the disclosure, but the disclosure is not limited to the following content.

Experimental Example 1

<Preparation of Quantum Dots>

First, a first solution is provided. 1630 milligrams of cadmium oxide, 20 milliliters of oleic acid, and 60 milliliters of octadecene are added to a three-necked flask to form the first solution, and the first solution is heated under vacuum at a temperature of 180° C. to perform a reaction. The three-necked flask is then filled with nitrogen and the temperature is increased to 250° C.

Next, a second solution is provided, and the first solution is mixed with the second solution to form a third solution.

The second solution of 1.0 milliliter formed by 0.6 millimole of trioctylphosphine selenide (TOP-Se) is injected into the three-necked flask, the first solution is mixed with the second solution to form the third solution, and the third solution is allowed to react at 250° C. The third solution is stirred to form a red suspension, and the red suspension is then cooled down to a room temperature.

Next, a fourth solution is provided and is added to the third solution to form a fifth solution. 600 milligrams of zinc acetate $(Zn(Ac)_2)$ powders and the fourth solution formed by 8.0 milliliters of trioctylphosphine and 200 milligrams of sulfur (S) are injected into the three-necked flask (i.e., the fourth solution is added to the third solution). A mixed solution containing the third solution and the fourth solution is allowed to react at 240° C. to form the fifth solution containing quantum dots.

Finally, a thermal treatment is performed to the fifth solution. After the mixed solution is reacted at 240° C. to form the fifth solution including the quantum dots, the thermal treatment is performed immediately. A temperature of the thermal treatment is 280° C., and a time period of the thermal treatment is 5 minutes. Next, a mixture obtained through the reaction is cooled down to 60° C. and is precipitated with 100 milliliters of ethanol. After performing centrifugal separation to the precipitate, the quantum dots of this experimental example are obtained. The quantum dots of this experimental example are the red quantum dots, and the quantum dots have an emission peak corresponding to a wavelength of 638 nm, and a full width at half maximum of the emission peak is 32.1 nm.

<Preparation of Light Emitting Material>

Next, the quantum dots obtained are mixed with n-hexane to form a quantum dot solution. A weight percentage of the quantum dots in the quantum dot solution is 1%. In addition, porous silicon dioxide particle carriers are mixed with n-hexane for forming a carrier solution. The porous silicon dioxide particles have an average diameter of 3 μm, an average surface pore size of 10 nm, and a specific area of 700 m²/g. In addition, the porous silicon dioxide particles are modified to be lipophilic. In the carrier solution, a weight percentage of the porous silicon dioxide particles is 5%.

0.25 grams of the quantum dot solution and 5 grams of the carrier solution are mixed and are allowed to stand for 10 minutes. Next, centrifugal filtration is performed to the solution including the quantum dots and the carriers to obtain the porous silicon dioxide particles to which the quantum dots are attached (i.e., the carriers to which the quantum dots are attached). The carriers to which the quantum dots are attached are then added to 250 grams of ethanol, and are uniformly dispersed.

A solution including a sealing material is provided, and the solution includes 0.5 gram of tetraethoxysilane (TEOS) and 2.5 grams of ammonia water $(NH_4OH)$ with a weight percentage of 29%. The solution including the sealing material is added to the ethanol solution containing the carriers to which the quantum dots are attached and is stirred for 4 hours at the room temperature. As such, a sealing layer is formed on a surface of the carriers to which the quantum dots are attached. A pH value of the solution including the carriers, the quantum dots, and the sealing layer ranges between 10 and 11. Next, the solution including the carriers, the quantum dots, and the sealing layer is subjected to centrifugal separation. The precipitate is washed 3 times with pure water and then dried, so as to obtain 0.26 grams of a micro-sized light emitting material.

Experimental Example 2

A manufacturing method of quantum dots of this experimental example is similar to the manufacturing method of the quantum dots of Experimental Example 1, and a difference therebetween lies in that a thermal treatment temperature of this experimental example is 290° C. Besides, a manufacturing method of a light emitting material of this experimental example is the same as the manufacturing method of the light emitting material of Experimental Example 1.

Comparative Example 1

A manufacturing method of quantum dots of Comparative Example 1 is similar to the manufacturing method of the quantum dots of Experimental Example 1, and a difference therebetween lies in that a thermal treatment temperature of Comparative Example 1 is 270° C. Besides, a manufacturing method of a light emitting material of Comparative Example 1 is the same as the manufacturing method of the light emitting material of Experimental Example 1.

Comparative Example 2

A manufacturing method of quantum dots of Comparative Example 2 is similar to the manufacturing method of the quantum dots of Experimental Example 1, and a difference therebetween lies in that a thermal treatment temperature of Comparative Example 2 is 300° C. Besides, a manufacturing method of a light emitting material of Comparative Example 2 is the same as the manufacturing method of the light emitting material of Experimental Example 1.

Comparative Example 3

A manufacturing method of quantum dots of Comparative Example 3 is similar to the manufacturing method of the quantum dots of Experimental Example 1, and a difference therebetween lies in that no thermal treatment is performed to a solution containing the quantum dots in Comparative Example 3. Besides, a manufacturing method of a light emitting material of Comparative Example 3 is the same as the manufacturing method of the light emitting material of Experimental Example 1.

Results of Experimental Example 1, Experimental Example 2, Comparative Example 1, Comparative Example 2, and Comparative Example 3

Optical properties of the quantum dots of Experimental Example 1, Experimental Example 2, Comparative Example 1, Comparative Example 2, and Comparative Example 3 are listed in the following Table 1.

TABLE 1

| | Experimental Example 1 | Experimental Example 2 | Comparative Example 1 | Comparative Example 2 | Comparative Example 3 |
|---|---|---|---|---|---|
| characteristic wavelength $\lambda_{c1}$ | 622 nm | 621 nm | 622 nm | 619 nm | 622 nm |
| emission intensity $I_E$ (CPS) at | $2.49 \times 10^6$ | $2.51 \times 10^6$ | $7.95 \times 10^5$ | $7.48 \times 10^5$ | $9.01 \times 10^5$ |

TABLE 1-continued

| | Experimental Example 1 | Experimental Example 2 | Comparative Example 1 | Comparative Example 2 | Comparative Example 3 |
|---|---|---|---|---|---|
| characteristic wavelength $\lambda_{c1}$ absorption intensity $I_A$ (Abs.) at characteristic wavelength $\lambda_{c1}$ | 0.007 | 0.007 | 0.007 | 0.006 | 0.022 |
| ratio of emission intensity $I_E$ to absorption intensity $I_A$ (CPS/Abs.) at characteristic wavelength $\lambda_{c1}$ | $3.55 \times 10^8$ | $3.58 \times 10^8$ | $1.14 \times 10^8$ | $1.25 \times 10^8$ | $4.10 \times 10^7$ |
| quantum yield | 55% | 56% | 47% | 45% | 40% |
| full width at half maximum of emission peak | 32.1 nm | 33.4 nm | 32.0 nm | 35.2 nm | 31.8 nm |
| diameter of inner core | 7.2 nm | 7.2 nm | 7.2 nm | 7.2 nm | 7.2 nm |
| thickness of outer shell | 2.2 nm | 1.0 nm | 1.5 nm | 0.9 nm | 1.4 nm |

With reference to FIG. 2A and FIG. 2B, the ratio of the emission intensity $I_E$ to the absorption intensity $I_A$ of the quantum dots at the characteristic wavelength $\lambda_{c1}$ is obtained via a light emission spectrum and an absorption spectrum of the quantum dots. The absorption spectrum is measured at a wavelength range of 400 nm to 700 nm when a concentration of the quantum dots is adjusted to a concentration at which an absorbance of the quantum dots at wavelength 450 nm is 0.135. The light emission spectrum is measured at a wavelength of 550 nm to 700 nm with the same concentration of the quantum dots in the foregoing absorption spectrum measurement.

The quantum yield is measured by dispersing the quantum dots in n-hexane which is served as a solvent, and the obtained solution is formulated as a sample solution with a transmittance of 71% to 79% in blue light (at a wavelength of 450 nm). A photoluminescence analyzer (HORIBA FluoroMax-3) together with an integrating sphere (HORIBA QUANTA-φ F-3029) are used for the solution and the solvent (n-hexane, blank experiment) to respectively measure an excitation integrating area and an emission integrating area of the sample solution and n-hexane, and the quantum yield of the sample solution is calculated further through the following formula (2).

$$\Phi = \frac{E_c - E_a}{L_a - L_c}; \qquad (2)$$

Φ refers to the quantum yield, $E_c$ is the emission integrating area of the sample solution, $E_a$ is the emission integrating area of n-hexane, $L_c$ is the excitation integrating area of the sample solution, and $L_a$ is the excitation integrating area of n-hexane.

With reference to Table 1, the ratios of the emission intensities $I_E$ to the absorption intensities $I_A$ of the quantum dots at the characteristic wavelength $\lambda_{c1}$ of Experimental Example 1 and Experimental Example 2 are both greater than the ratios of the emission intensities $I_E$ to the absorption intensities $I_A$ of the quantum dots at the characteristic wavelength $\lambda_{c1}$ of Comparative Example 1, Comparative Example 2, and Comparative Example 3. In this way, the quantum yields of the quantum dots of Experimental Example 1 and Experimental Example 2 are greater than the quantum yields of the quantum dots of Comparative Example 1, Comparative Example 2, and Comparative Example 3.

In addition, it can be seen from the results of Experimental Example 1 and Comparative Example 3 that the quantum yield of the quantum dots is increased and the full width at half maximum of the emission peak is barely affected when the thermal treatment is performed to the quantum dots. Further, it can be seen from the results of Experimental Example 1 and Comparative Example 1 that the quantum yield of the quantum dots can be increased significantly if the temperature of the thermal treatment is higher than 270° C. On the other hand, when the temperature of the thermal treatment is greater than or equal to 300° C., the quantum yield of the quantum dots drops considerably, and the full width at half maximum of the emission peak is increased significantly based on the results of Experimental Example 2 and Comparative Example 2.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:
1. A manufacturing method of a quantum dot, comprising:
providing a first solution comprising a group 12 element, a group 13 element, or a group 14 element;
providing a second solution comprising a group 15 element or a group 16 element;
mixing the first solution with the second solution to form a third solution;
adding a material comprising the group 12 element, the group 13 element, or the group 14 element and a fourth solution comprising the group 15 element or the group 16 element to the third solution to form a fifth solution comprising the quantum dot; and
performing a thermal treatment to the fifth solution, wherein a temperature of the thermal treatment is higher than a temperature of forming the fifth solution comprising the quantum dot by 15° C. to 75° C., and a time period of the thermal treatment is 3 minutes to 7 minutes;

a ratio of an emission intensity to an absorption intensity of the quantum dot at a characteristic wavelength ranges from $1.5\times10^8$ CPS/Abs. to $2.0\times10^9$ CPS/Abs. after the thermal treatment, and the characteristic wavelength is a shorter wavelength of two wavelengths corresponding to half of a maximum intensity of an emission peak of the quantum dot after the thermal treatment.

2. The manufacturing method of the quantum dot as claimed in claim 1, wherein the temperature of the thermal treatment is higher than the temperature of forming the fifth solution comprising the quantum dot by 20° C. to 50° C.

3. The manufacturing method of the quantum dot as claimed in claim 1, wherein a ratio of a diameter of the quantum dot after the thermal treatment to a diameter of the quantum dot before the thermal treatment ranges from 1.0 to 1.3.

4. The manufacturing method of the quantum dot as claimed in claim 3, wherein the quantum dot comprises an inner core and an outer shell, and a ratio of a thickness of the outer shell after the thermal treatment to a thickness of the outer shell before the thermal treatment ranges from 1.0 to 1.6.

5. The manufacturing method of the quantum dot as claimed in claim 1, wherein the ratio of the emission intensity to the absorption intensity of the quantum dot at the characteristic wavelength ranges from $2.0\times10^8$ CPS/Abs. to $1.0\times10^9$ CPS/Abs.

6. The manufacturing method of the quantum dot as claimed in claim 1, wherein the ratio of the emission intensity to the absorption intensity of the quantum dot at the characteristic wavelength ranges from $2.0\times10^8$ CPS/Abs. to $6.0\times10^8$ CPS/Abs.

7. The manufacturing method of the quantum dot as claimed in claim 1, wherein the temperature of forming the fifth solution comprising the quantum dot ranges from 220° C. to 260° C.

* * * * *